(12) United States Patent
Kalva et al.

(10) Patent No.: US 12,423,253 B2
(45) Date of Patent: Sep. 23, 2025

(54) CURRENT-CONTROLLED BUFFER USING ANALOG BIAS

(71) Applicant: Micron Technology, Inc., Boise, ID (US)

(72) Inventors: Bhargav Kalva, Boise, ID (US); Won Joo Yun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 194 days.

(21) Appl. No.: 18/506,229

(22) Filed: Nov. 10, 2023

(65) Prior Publication Data

US 2024/0248861 A1  Jul. 25, 2024

Related U.S. Application Data

(60) Provisional application No. 63/481,482, filed on Jan. 25, 2023.

(51) Int. Cl.
*G06F 13/20*  (2006.01)

(52) U.S. Cl.
CPC ...... *G06F 13/20* (2013.01); *G06F 2213/0002* (2013.01)

(58) Field of Classification Search
CPC .................................................. G06F 13/20
USPC ....................................................... 710/105
See application file for complete search history.

(56) References Cited

U.S. PATENT DOCUMENTS

| | | | | |
|---|---|---|---|---|
| 5,043,675 A | * | 8/1991 | Gilbert | H03F 3/45479 330/261 |
| 5,239,274 A | * | 8/1993 | Chi | H03B 27/00 331/177 R |
| 5,805,012 A | * | 9/1998 | Jeon | H03K 19/00384 327/543 |
| 5,939,904 A | * | 8/1999 | Fetterman | H03F 3/45224 327/67 |
| 6,084,433 A | * | 7/2000 | Momtaz | H03K 5/084 326/27 |
| 7,271,674 B1 | * | 9/2007 | Butenhoff | H03G 3/3036 331/74 |
| 8,766,712 B2 | * | 7/2014 | Shanan | H03J 1/005 327/552 |
| 2007/0115030 A1 | * | 5/2007 | Bhattacharya | H04L 25/0276 326/83 |
| 2009/0102568 A1 | * | 4/2009 | Lu | H03L 1/022 331/75 |

(Continued)

*Primary Examiner* — Paul R. Myers
(74) *Attorney, Agent, or Firm* — Fletcher Yoder, P.C.

(57) ABSTRACT

A semiconductor device includes a pair of transistors configured to implement buffering of input data to outputs. The semiconductor device also includes a first transistor configured to receive a common-mode of the outputs at a gate terminal of the first transistor. The semiconductor device also includes a current source configured to control a tail current from the pair of transistors. Additionally, the semiconductor device includes a second transistor configured to adjust the tail current based at least in part on changes in a reference voltage used by the pair of transistors to buffer the input data. Furthermore, the semiconductor device includes a third transistor configured to adjust the tail current based at least in part on changes in locally generated reference voltage based at least in part on a process and temperature variations.

20 Claims, 4 Drawing Sheets

(56) References Cited

U.S. PATENT DOCUMENTS

2011/0234263 A1\* 9/2011 Shima ............ H03K 19/017536
                                                    327/109

\* cited by examiner

CURRENT-CONTROLLED BUFFER USING ANALOG BIAS

CROSS-REFERENCE TO RELATED APPLICATIONS

This application claims priority to U.S. Application No. 63/481,482, filed Jan. 25, 2023, entitled "Current-Controlled Buffer Using Analog Bias," which is incorporated by reference herein in its entirety for all purposes.

BACKGROUND

Field of the Present Disclosure

Embodiments of the present disclosure relate generally to semiconductor devices. More specifically, embodiments of the present disclosure relate to a current-controlled buffer that is controlled using an analog bias for the semiconductor devices (e.g., memory devices).

Description of Related Art

Generally, a computing system may include electronic devices that, in operation, communicate information via electrical signals. For example, a computing system may include a processor communicatively coupled to a memory device, such as a dynamic random-access memory (DRAM) device. In this manner, the processor may communicate with the memory device, for example, to retrieve executable instructions, retrieve data to be processed, by the processor, and/or store data output from the processor. To perform these operations, the processor and memory device may exchange command address (CA) bits to indicate the type and memory location for the operation to be performed. The CA bits may be buffered in one or more CA buffers. The CA buffers may use current control and programmable current sources to compensate for process variations in the transistors on a chip. However, each chip is programmed manually based on the process and reference voltage for that chip. This programming process takes a large amount of time. Also, the digital circuitry used to implement the programming and control may be relatively large consuming excess chip space. Additionally, the programming may not factor in temperature leading to potential degradation of the performance of the CA buffers over time. Furthermore, common mode noise may degrade performance over time and/or performance at higher frequencies. In some situations, multiple CA buffers may be programmed together to save programming time and/or implementation area consumption. However, this combination cannot mitigate for variation across CA buffers.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, digitally controlled command/address (CA) buffers may take a relatively long time to perform training and programming. Furthermore, this control scheme may consume excess space for digital implementation and trace and may be unable to factor in some parameters (e.g., temperature) without adding even more circuitry. Additionally, the digitally controlled CA buffers may degrade over time and/or at high frequencies due to lack of common-mode noise control. Instead, analog-bias-based current controlled CA buffers provide enhancements over the digital-control-based buffers. For instance, the analog-bias-based current controlled CA buffers may be implemented without a lengthy silicon testing and programming timing enabling semiconductor products using the analog-bias-based current controlled CA buffers to be delivered more quickly than those using the digitally controlled CA buffers. Furthermore, as the current control of the analog-bias-based current controlled CA buffers does not rely on digital controls, the analog-bias-based current controlled CA buffers may require less silicon area due to no digital logic implementations or signal trace between the digital logic implementations and the analog-bias-based current controlled CA buffers. Furthermore, the analog-bias-based current controlled CA buffers provides control of the common-mode across process, temperature, and reference voltage variations. Moreover, since each analog-bias-based current controlled CA buffer may be controlled locally with relatively little more area consumed, each analog-bias-based current controlled CA buffer may be independently driven to compensate for difference conditions (e.g., temperature) between different analog-bias-based current controlled CA buffers in a single device. The analog-bias-based current controlled CA buffers may also have an enhanced high-frequency response as common-mode noise is attenuated with analog loop controls. Additionally, the analog-bias-based current controlled CA buffers may also provide an enhanced eye opening in the data eye of the buffered data when compared to the digitally controlled CA buffers.

Figure 1:
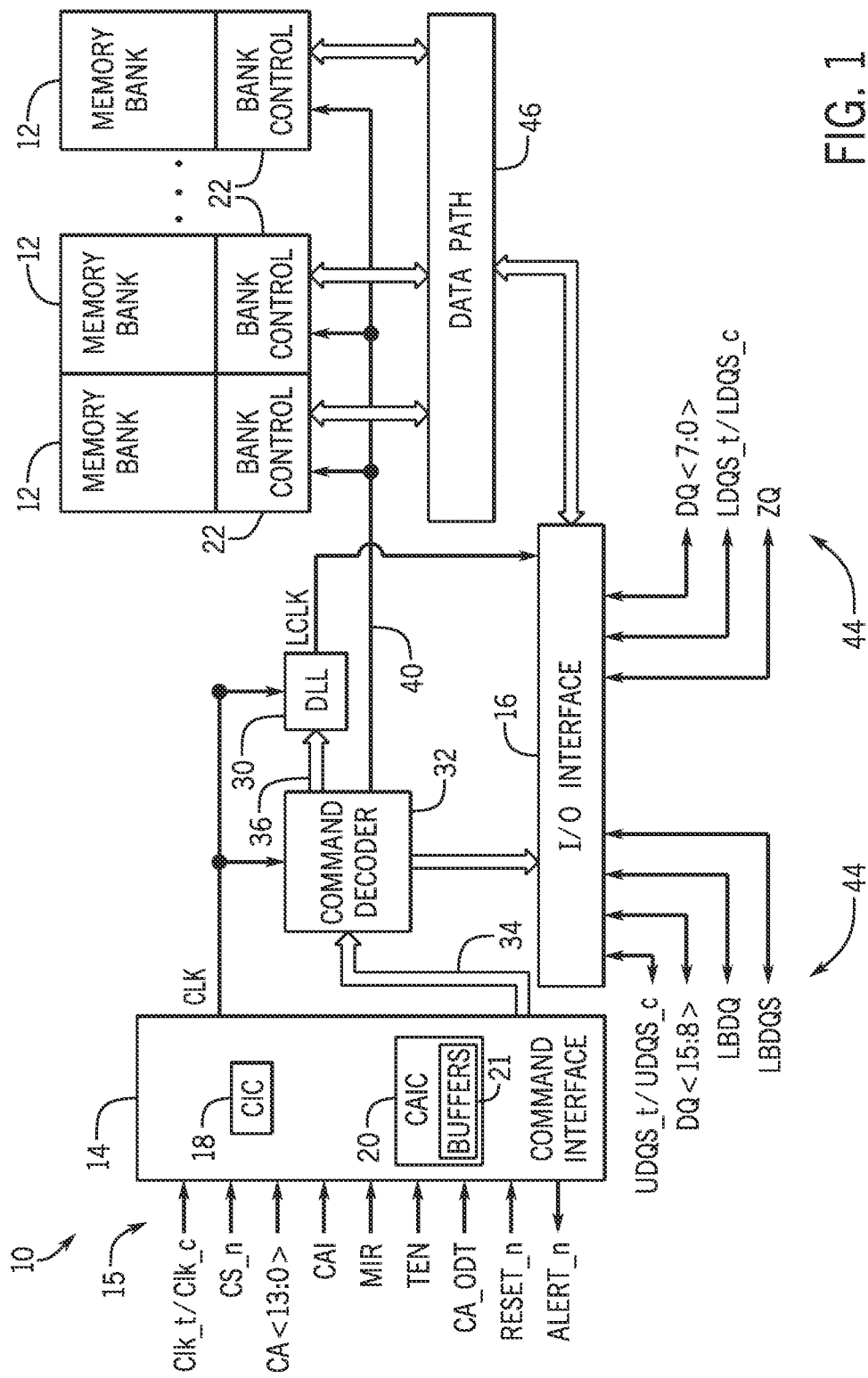
FIG. 1 is a simplified block diagram illustrating certain features of a memory device having bank control that includes a command address input circuit having a command address buffer, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit (CIC) 18 and a command address input circuit (CAIC) 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar/complementary clock signal Clk_c. The positive clock edge for DDR refers to the point where the rising true clock signal Clk_t crosses the falling complementary clock signal Clk_c, while the negative clock edge indicates the transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal Clk_t and the complementary clock signal Clk_c and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes the bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include the CAIC 20, which is configured to receive and transmit the commands to provide access to the memory banks 12, through the command decoder 32, for instance. For instance, the CAIC 20 may include a number of command/address (CA) buffers 21 that are used to buffer the CA bits received and/or transmitted using the CAIC 20. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data buses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description. Furthermore, although the foregoing discusses the memory device 10 as being a DDR5 device, the memory device 10 may be any suitable device (e.g., a low-power double data rate (LPDDR) device, a double data rate type 4 DRAM (DDR4) device, a ferroelectric RAM device, or a combination of different types of memory devices). Indeed, in some embodiments, the CA buffers 21 may be used in other semiconductor devices or even the memory device 10 to buffer any data values. In other words, the applicability of the CA buffers 21 to semiconductor devices may extend beyond use only in memory devices 10 and/or beyond use as only a buffer for CA bits.

Figure 2:
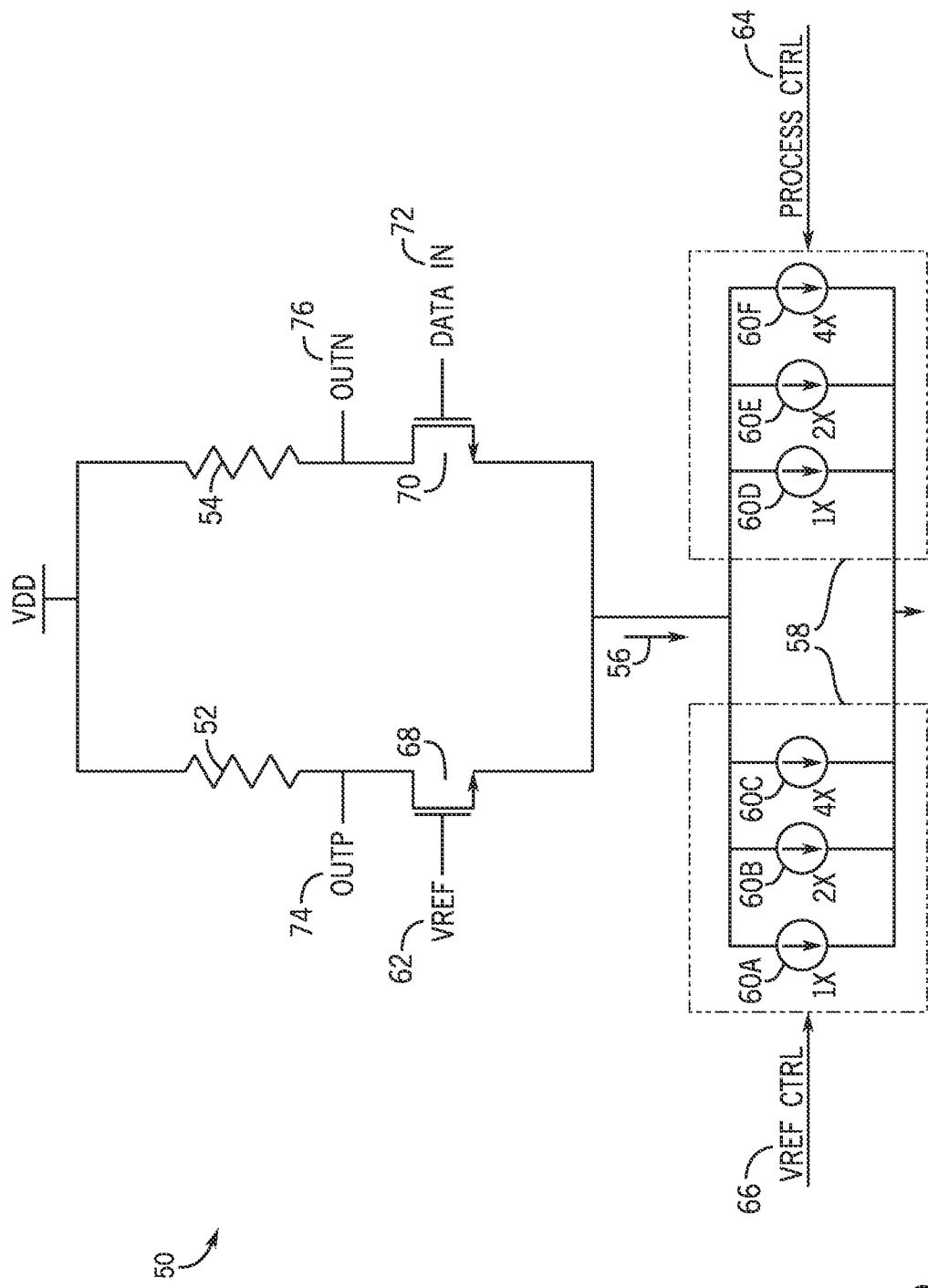
FIG. 2 is a circuit diagram of the command address buffer of FIG. 1 using digital control, according to an embodiment of the present disclosure.

FIG. 2 is a circuit diagram of an embodiment of a CA buffer 50 that may be one of the CA buffers 21 of FIG. 1. Although specific circuitry is shown in the illustrated embodiment of an instance of the CA buffer 50 in FIG. 2, the CA buffers 21 may include additional circuitry, such as additional copies of the illustrated CA buffer 50 and/or additional stages in the CA buffers 21. Furthermore, the illustrated embodiment of the CA buffer 50 may depict a current mode logic (CML) structure that has a fixed resistor load via resistors 52 and 54 but may have any suitable physical structure. The CA buffer 50 also includes a programmable tail current 56 that is programmable using a programmable current generator 58. The programmable current generator 58 may use one or more current sources 60 (individually referred to as current sources 60A, 60B, 60C, 60D, 60E, and 60F) that are programmable.

The programmable current generator 58 may be used to compensate for process variation and/or reference voltage (Vref) 62 changes. For instance, the programmable current generator 58 uses a process control signal 64 to change the tail current 56 to compensate for process variation in a chip used to implement the memory device 10. For example, the process control signal 64 may turn on more current sources 60 for slow corners and fewer current sources 60 for fast corners.

The programmable current generator 58 may also be used to compensate for the variance in Vref 62 using a Vref control signal 66. When Vref 62 changes, the tail current 56 may change due to insufficient saturation margin. An input pair of NMOS transistors 68 and 70 may exit saturation mode that may cause a reduction in drive strength. The NMOS transistor 68 has its gate terminal connected to Vref 62, and the NMOS transistor 70 has its gate terminal connected to incoming data 72 (e.g., a CA bit). Vdg variation of the NMOS transistors 68 and/or 70 may change a positive output 74 and/or a negative output 76. To compensate for these problems, the programming of the Vref control signal 66 may be used to change the tail current 56 along with changes in Vref 62. For instance, for every step value (e.g., 25 mV) between a minimum value of Vref 62 and a maximum value of Vref 62, a corresponding value for the tail current 56 and/or the Vref control signal 66 may be used. In other words, the amount of tail current 56 may be reduced as Vref 62 increases to provide a greater and/or consistent drive strength through the entire range of possible Vref 62 values. By reducing the tail current 56 when Vref 62 increases, an output common-mode of the positive output 74 and the negative output 76 also adjusts higher. This increase in common mode enables the input pair of NMOS transistors 68 and 70 to remain in saturation and have an increased drive strength.

Although increasing the common-mode may increase some aspects of the operation of the CA buffer 50, the CA buffer 50 does not have any direct control over the common-mode that can lead to common-mode swinging. Additionally, the CA buffer 50 may have other drawbacks. Specifically, it may take a relatively large amount of testing time to train and program the Vref control signal 66 and/or the process control signal 64 of the CA buffer 50 in each chip for process and Vref 62 variation. Furthermore, although the CA buffer 50 can compensate for Vref 62 variations and process variations, the CA buffer 50 does not compensate for temperature variation without adding an additional local temperature sensor circuit to monitor temperature. Additionally, the monitored temperature would also need to be compensated for in programming taking additional training time and semiconductor space to implement. Even without the temperature monitoring capability, the CA buffer 50 requires additional digital logic to program the current sources based on Vref 62. Furthermore, much routing area is to be consumed routing digital signal tracks between the logic implementations and the CA buffers 50. To reduce some area concerns, multiple CA buffers 50 may share the same code/implementation/programming. However, any stress/thermal differences between the CA buffers 50 in the silicon will result in degraded performance due to less flexibility to compensate conditions for the CA buffers 50 differently.

Figure 3:
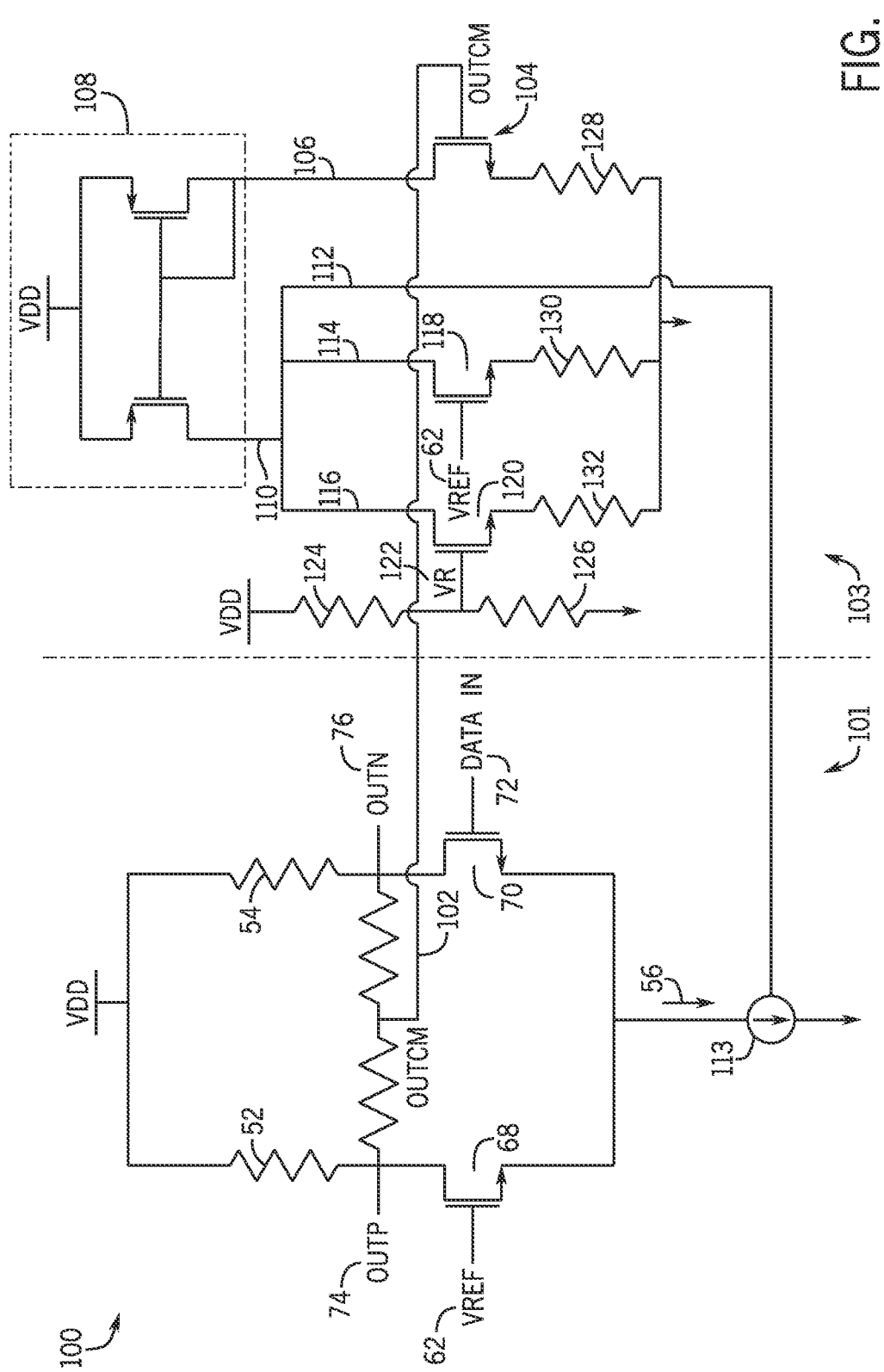
FIG. 3 is a circuit diagram of command address buffer of FIG. 1 using analog-bias-based control, according to an embodiment of the present disclosure.

To address some of these issues, an analog-bias-controlled embodiment of the CA buffers 21 may be used. For instance, FIG. 3 is a circuit diagram of a CA buffer 100 that may be used as at least one of the CA buffers 21 of FIG. 1. Although specific circuitry is shown in the illustrated embodiment of an instance of the CA buffer 100 in FIG. 3, the CA buffers 21 may include additional circuitry, such as additional copies of the illustrated CA buffer 100 and/or additional stages in the CA buffers 21. A portion 101 of the CA buffer 100 may be like the CA buffer 50 except that the programmable current generator 58 is omitted and instead a common-mode 102 may be sampled from between the positive output 74 and the negative output 76. In the portion 103, the common-mode 102 is transmitted to a gate of an NMOS transistor 104. The NMOS transistor 104 is coupled to a first leg 106 of a current mirror 108 and between the first leg 106 and ground. A second leg 110 is connected as a feedback, via path 112, to a current source 113 that sets the tail current 56. Thus, the amount of current in the tail current 56 is based at least in part on the common-mode voltage. The amount of charge on the path 112 is impacted by how much charge is on the paths 114 and 116 from the second leg 110. In other words, the charge on the second leg 110 may be at least partially dissipated to ground 1) through the path 114 based on the Vref 62 and 2) through the path 116 based on process and temperature to compensate for such process, temperature and Vref 62 variations.

An NMOS transistor 118 is coupled to the path 114 between the second leg 110 and ground. The gate terminal of the NMOS transistor 118 is coupled to Vref 62. As Vref 62 increases, more charge is dissipated to ground via the NMOS transistor 118 thereby decreasing the tail current 56. The common-mode 102 then rises in a controlled manner that is based at least in part on a size/strength of the NMOS transistor 118. In other words, the CA buffer 100 performs Vref 62 compensation similar to the CA buffer 50 but with some common-mode 102 control.

An NMOS transistor 120 is coupled to the path 116 between the second leg 110 and ground. The gate terminal of the NMOS transistor 120 is coupled to a locally generated reference voltage (VR) 122 that is used to control process and temperature effects. VR 122 compensates for the process and temperature effects by controlling the current so that the common-mode 102 remains consistent across different processes and temperatures by deriving VR 122 between two resistors 124 and 126 and controlling the NMOS transistor 120 with VR 122. Specifically, the current through the NMOS transistor 120 is process corner and temperature dependent. Using this dependence, in a fast corner, VR 122 and the NMOS transistor 120 dissipates more charge causing the tail current 56 to be reduced while, in a slow corner, VR 122 and the NMOS transistor 120 dissipates less charge to increase the tail current 56 to control the common-mode 102 output.

The output voltage of the common-mode 102 may be equal to or at least based on VR 122 and a portion of Vref 62. The portion of Vref 62 is a percentage of Vref 62 where the percentage is based at least in part on a ratio between the NMOS transistor 120 and the NMOS transistor 118. In other words, Vref 62 is weighted using multiplication of the ratio times the Vref 62. Furthermore, the relationship between current on the paths 112, 114, and 116 may be based at least in part on the relationship of the resistance of the resistors 128, 130, and/or 132.

Figure 4:
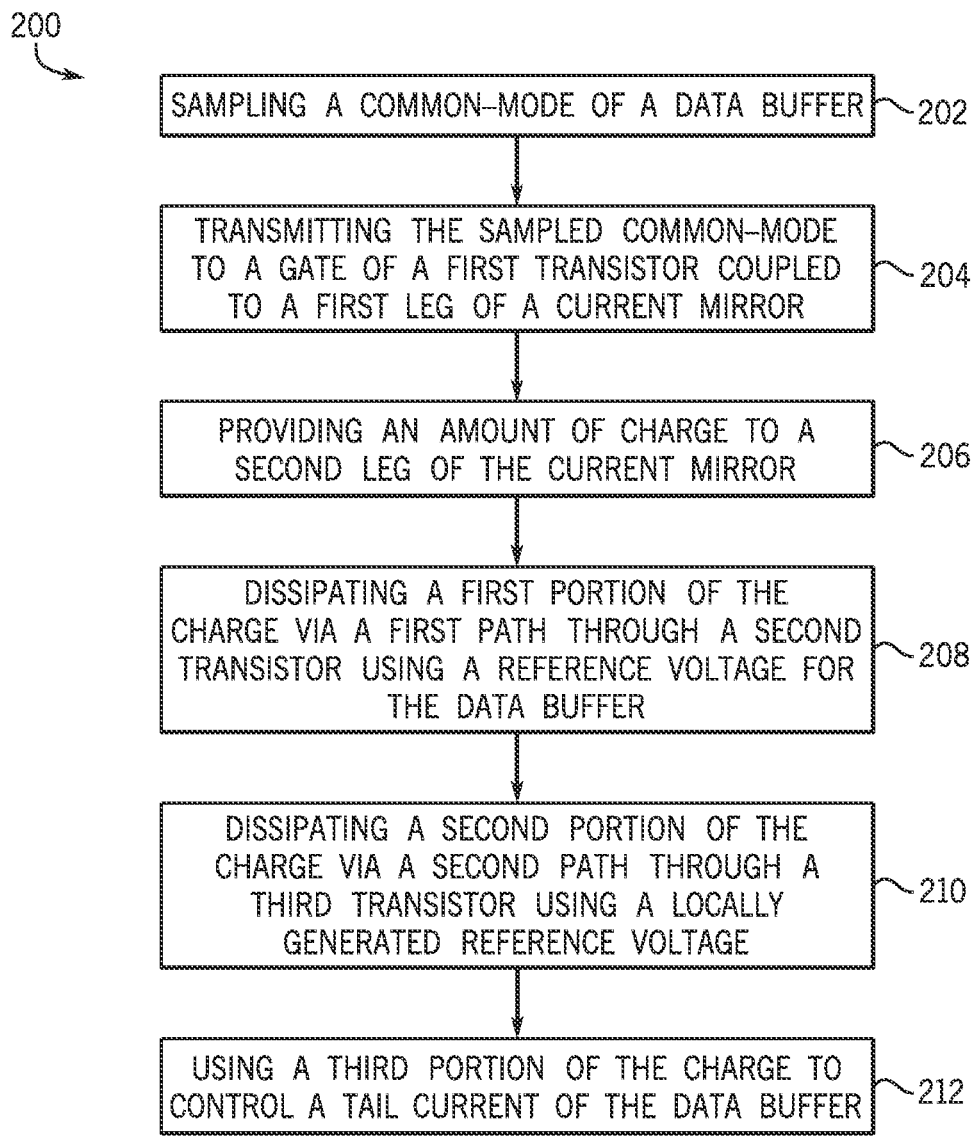
FIG. 4 is a flow diagram of a process utilized by the command address buffer of FIG. 3.

FIG. 4 is a flow diagram of a process 200 utilizing the CA buffer 100 of FIG. 3. The process 200 includes sampling the common-mode 102 of an output of a data buffer (CA buffer 100) of the semiconductor device (block 202). The output may include a differential signal to represent data (e.g., CA bits). The CA buffer 100 also transmits the sampled common-mode to a gate of a first transistor (NMOS transistor 104) that is coupled to the first leg 106 of the current mirror 108 (block 204). The CA buffer 100 uses the current mirror 108 to provide an amount of charge to a second leg 110 of the current mirror 108 based at least in part on the sampled common-mode 102 (block 206). Furthermore, the CA buffer 100 dissipates a first portion of the charge via a first path (path 114) from the second leg 110 through a second transistor (NMOS transistor 118) by controlling the second transistor using a reference voltage (Vref 62) of the data buffer coupled to a gate terminal of the second transistor (block 208). Thus, the first portion may change as the Vref 62 changes. Additionally, the CA buffer 100 dissipates a second portion of the charge via a second path (path 116) from the second leg 110 through a third transistor by controlling the third transistor using locally generated reference voltage (VR 122) coupled to a gate terminal of the third transistor (NMOS transistor 120) (block 210). As previously noted, VR 122 may be generated between resistors 124 and 126 that are coupled in series between a voltage supply (VDD) and ground. Additionally, since VR 122 varies with temperature and the process corner for the chip of the semiconductor device, the second portion varies with temperature and process corner variations. Furthermore, the CA buffer 100 uses a third portion of the charge to control a tail current 56 of the data buffer (CA buffer 100) (block 212). For instance, the control of the tail current 56 may be performed via a third path (e.g., path 112) from the second leg 110 of the current mirror 108. Since the amount of charge dissipated from the second leg varies with Vref 62 changes, temperature changes, and process corner changes, the third portion (and the tail current 56) vary with Vref 62 changes, temperature changes, and process corner changes.

As previously noted, using the analog-bias-based current controlled CA buffer 100 may provide tangible benefits over the CA buffer 50. For instance, the CA buffer 100 may be implemented without a lengthy silicon testing and programming timing enabling semiconductor products using the CA buffer 100 to be delivered more quickly than those using the CA buffer 50. Furthermore, as the current control of the CA buffer 100 does not rely on digital controls, the CA buffer 100 may require less silicon area due to no digital logic implementations or signal trace between the digital logic implementations and the CA buffers 100. Furthermore, the CA buffer 100 provides control of the common-mode 102 across process, temperature, and Vref 62 variations. Moreover, since each CA buffer 100 may be controlled locally with relatively little more area consumed, each CA buffer 100 may be independently driven to compensate for difference conditions (e.g., temperature) between different CA buffers 100 in a single device. The CA buffer 100 may also have an enhanced high-frequency response as common-mode noise is attenuated with analog loop controls. Additionally, the CA buffer 100 may also provide an enhanced eye opening in the data eye of the buffered data when compared to the CA buffer 50.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A semiconductor device, comprising:
a pair of transistors configured to implement buffering of input data to outputs;
a first transistor configured to receive a common-mode of the outputs at a gate terminal of the first transistor;
a current source configured to control a tail current from the pair of transistors;
a second transistor configured to adjust the tail current based at least in part on changes in a reference voltage used by the pair of transistors to buffer the input data; and
a third transistor configured to adjust the tail current based at least in part on changes in a locally generated reference voltage based at least in part on process and temperature variations.

2. The semiconductor device of claim 1, wherein one of the pair of transistors is configured to receive the reference voltage at its respective gate terminal.

3. The semiconductor device of claim 1, comprising a pair of serially connected resistors between a power supply and ground, wherein the locally generated reference voltage is configured to be generated between the pair of serially connected resistors.

4. The semiconductor device of claim 1, wherein a gate terminal of the third transistor is configured to be coupled to the locally generated reference voltage.

5. The semiconductor device of claim 1, wherein a voltage of common-mode is equal to the locally generated reference voltage plus reference voltage after weighting, wherein the weighting is a ratio of sizes between the third transistor and the second transistor multiplied by the reference voltage.

6. The semiconductor device of claim 1, wherein currents through the second and third transistors are based at least in part on a current through the first transistor due to the common-mode.

7. The semiconductor device of claim 6, wherein the first transistor is coupled to a first leg of a current mirror, and the second and third transistors are coupled to a second leg of the current mirror.

8. The semiconductor device of claim 7, comprising a control path to the current source from the second leg of the current mirror that is configured to adjust the tail current based at least in part on the common-mode, the reference voltage, and the locally generated reference voltage.

9. The semiconductor device of claim 8, wherein an amount of charge through the control path is based at least in part on dissipation of charge on the second leg of the current mirror through the second and third transistors.

10. A method of operating a semiconductor device, comprising:
sampling a common-mode of an output of a data buffer of the semiconductor device as a sampled common-mode;
transmitting the sampled common-mode to a gate of a first transistor that is coupled to a first leg of a current mirror;
providing a charge to a second leg of the current mirror based at least in part on the sampled common-mode;
dissipating a first portion of the charge via a first path from the second leg through a second transistor by controlling the second transistor using a reference voltage of the data buffer coupled to a gate terminal of the second transistor;
dissipating a second portion of the charge via a second path from the second leg through a third transistor by controlling the third transistor using a locally generated reference voltage coupled to a gate terminal of the third transistor; and
using a third portion of the charge to control a tail current of the data buffer.

11. The method of claim 10, wherein output data from the output of the data buffer comprises command/address bits.

12. The method of claim 10, wherein the first portion varies as the reference voltage varies for the semiconductor device.

13. The method of claim 10, wherein the second portion varies with temperature and process corners for the semiconductor device.

14. The method of claim 10, wherein the third portion varies with variation of the reference voltage, variation of temperature, and for different process corners for the semiconductor device.

15. The method of claim 10, comprising generating the locally generated reference voltage between two resistors coupled in series between a supply voltage and ground.

16. The method of claim 10, wherein using the third portion of the charge to control the tail current of the data buffer comprises using a third path from the second leg of the current mirror.

17. A data buffer, comprising:
- a first input transistor configured to receive input data at a gate terminal of the first input transistor;
- a second input transistor configured to receive a reference voltage at a gate terminal of the second input transistor;
- a common-mode transistor configured to receive a common-mode between first terminals of the first and second input transistors, wherein the common-mode transistor is configured to receive the common-mode at a gate terminal of the common-mode transistor;
- a current source configured to control a tail current from second terminals of the first and second input transistors;
- a first control transistor configured to receive the reference voltage at a gate terminal of the first control transistor;
- a second control transistor configured to receive a locally generated reference voltage at a gate terminal of the second control transistor; and
- a current mirror comprising:
  - a first leg coupled to the common-mode transistor; and
  - a second leg coupled to the first control transistor, the second control transistor, and the current source.

18. The data buffer of claim 17, wherein the first control transistor is configured to adjust the tail current based at least in part on changes in the reference voltage.

19. The data buffer of claim 17, wherein the second control transistor is configured to adjust the tail current based at least in part on changes in the locally generated reference voltage.

20. The data buffer of claim 19, wherein the changes in the locally generated reference voltage are based at least in part on process and temperature variations.

* * * * *